(12) United States Patent
Flynn

(10) Patent No.: US 7,358,474 B2
(45) Date of Patent: Apr. 15, 2008

(54) SYSTEM AND METHOD FOR TIME-DELAY INTEGRATION IMAGING

(75) Inventor: David John Flynn, Southbury, CT (US)

(73) Assignee: Goodrich Corporation, Charlotte, NC (US)

( * ) Notice: Subject to any disclaimer, the term of this patent is extended or adjusted under 35 U.S.C. 154(b) by 84 days.

(21) Appl. No.: 11/266,564

(22) Filed: Nov. 3, 2005

(65) Prior Publication Data

US 2007/0096772 A1  May 3, 2007

(51) Int. Cl.
*G01C 21/02* (2006.01)
*G01C 21/00* (2006.01)
*G01B 11/26* (2006.01)
*H04B 7/185* (2006.01)

(52) U.S. Cl. .............. 250/206.2; 342/355; 701/226; 356/139.01

(58) Field of Classification Search .......... 250/206.2, 250/203.6; 356/139.01, 139.02; 342/355; 701/222, 226
See application file for complete search history.

(56) References Cited

U.S. PATENT DOCUMENTS

| | | | |
|---|---|---|---|
| 4,740,681 A | 4/1988 | Tsuno | |
| 5,260,557 A | 11/1993 | Kissh et al. | |
| 5,453,781 A | 9/1995 | Stein | |
| 5,512,743 A | 4/1996 | Shaffer et al. | |
| 5,960,097 A | 9/1999 | Pfeiffer et al. | |
| 6,236,939 B1 | 5/2001 | Wu et al. | |
| 6,417,798 B1 * | 7/2002 | Joerck | 342/355 |
| 2004/0080635 A1 * | 4/2004 | Hong | 348/247 |
| 2004/0101210 A1 * | 5/2004 | Weinstein et al. | 382/284 |

OTHER PUBLICATIONS

*Gaia—Taking the Galactic Census*; Sep. 30, 2003 (Rev. 0); 10 pages (selected pp. 21 condensed pages).
Marc A. Murison; *Consequences of Measuring Stellar Positions at the 50 Microarsceond Level*; Feb. 26, 2001; 66 pages; also available at <http://aa.usno.navy.mil/murison/talks/>.
Carl G. Pfeiffer, Brian L. Masson; Technology Demonstration by the Onboard Signal and Data Processor; *Johns Hopkins APL Technical Digest*; 1996; pp. 237-245; vol. 17, No. 2.
U. Bastian, M. Biermann; *Asometric Meaning and Interpretation of High-Prevision Time Delay Integration CCD Data*, Feb. 15, 2005; 15 pages.

* cited by examiner

*Primary Examiner*—Davienne Monbleau
*Assistant Examiner*—Brian J Livedalen
(74) *Attorney, Agent, or Firm*—Alston & Bird LLP

(57) ABSTRACT

A system is provided that includes an optical arrangement, an assembly of a plurality of detectors, and a signal processor. The optical arrangement is capable of viewing a scene that includes an object, where the scene is capable of moving through a field of view of the optical arrangement during each of a plurality of transit periods. The detectors of the assembly are arranged in a vertical scanning direction corresponding to a direction of movement of the scene, and are separately capable of producing an image of the object for each transit period in accordance with a time-delay integration technique. The signal processor, then, is capable of determining the angular position of the object for each transit period based upon the images produced by the detectors.

21 Claims, 10 Drawing Sheets

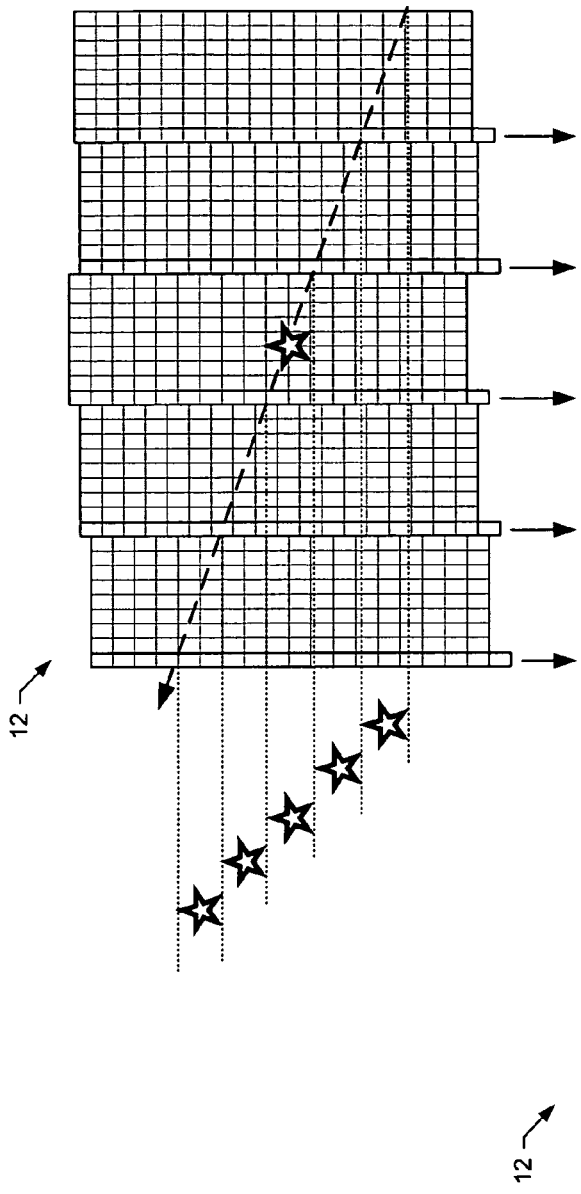
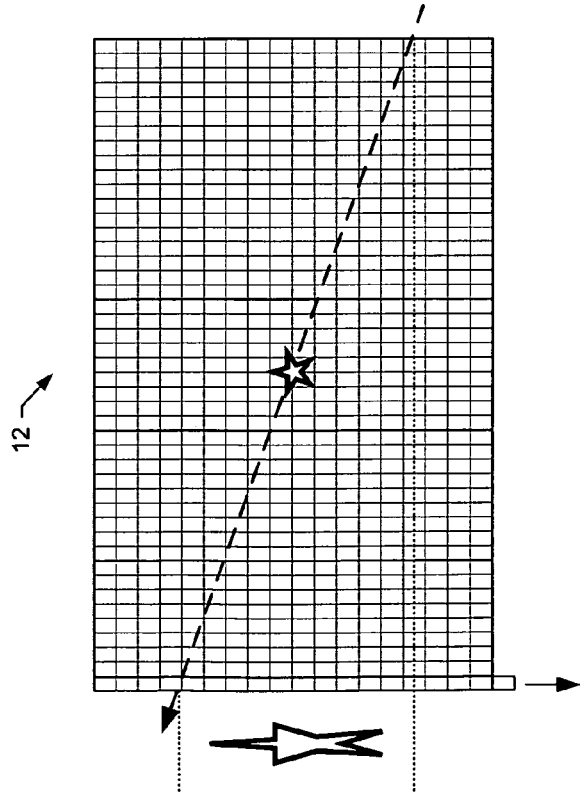
FIG. 6b.
FIG. 6a.

FIXED PATTERN/S-CURVE ERRORS

SYSTEM AND METHOD FOR TIME-DELAY INTEGRATION IMAGING

FIELD OF THE INVENTION

The present invention generally relates to systems and methods for time-delay integration (TDI) imaging and, more particularly, to systems and methods for TDI imaging of astronomical objects (e.g., stars) observed from a spacecraft to thereby determine and control the attitude of the spacecraft.

BACKGROUND OF THE INVENTION

In the space industry, spacecraft such as satellites are positioned in space for a number of different purposes including, for example, collecting and/or communicating data, information and the like. To effectively operate, however, the attitude of these satellites, including the satellites' azimuth and elevation angle, must typically be stabilized. One method to stabilize the attitude of a satellite is to set it in a spinning motion. Being in an otherwise uncontrolled environment, however, a number of different objects and/or events can disrupt a satellite's attitude, and accordingly, disrupt proper operation of the satellite. To determine, and thus enable control, of a satellite's attitude, a number of satellites include star trackers that image a fixed astronomical object, such as a star, as the satellites spin. From the imaged object, the star tracker is capable of determining the current attitude of the satellite. Then, if the current attitude is offset from the desired attitude of the satellite, the satellite can be controlled to reposition itself to the desired attitude.

One conventional technique for a star tracker to image a star is referred to as time-delay integration (TDI) imaging. In accordance with such a technique, a frame transfer element generates a continuous image of a fixed star, considered moving relative to a spinning satellite. The frame transfer element typically generates the continuous image via a stack of linear arrays of imaging elements, such as charge-coupled devices (CCDs), aligned with and synchronized to the movement of the star. Accordingly, as the image of the star moves from one line to the next, the stored charge moves along with the image, thereby providing a higher-resolution image at low light levels.

Although a number of different star scanners operating in accordance with TDI imaging techniques have been developed, it is generally desirable to improve upon such conventional devices.

SUMMARY OF THE INVENTION

In light of the foregoing background, exemplary embodiments of the present invention provide an improved system and method for time-delay integration (TDI) imaging of objects. In accordance with exemplary embodiments of the present invention, the system includes an assembly of a plurality of separate detectors that are each capable of producing an image of an object during a transit period of the system, the transit period corresponding to movement of a scene including the object through a field of view. By providing an assembly including a plurality of separate detectors for separately imaging the object, the system of exemplary embodiments of the present invention provides a number of advantages. For example, the system of exemplary embodiments of the present invention is capable of operating with a higher update rate and reduced data latency.

In addition, the system of exemplary embodiments of the present invention operates with robustness in space radiation environments, reduced impact of image smear, reduced impact of correlated fixed pattern errors, reduced impact of S-curve errors, reduced power required to perform detector clocking, and reduced impact of degraded charge transfer efficiency.

According to one aspect of the present invention, a system is provided that includes an optical arrangement, an assembly of a plurality of detectors, and a signal processor. The optical arrangement is capable of viewing a scene that includes an object, where the scene is capable of moving through a field of view of the optical arrangement during each of a plurality of transit periods. The detectors of the assembly are arranged in a vertical scanning direction corresponding to a direction of movement of the scene, and are separately capable of producing an image of the object for each transit period in accordance with a time-delay integration technique. The signal processor, then, is capable of determining the angular position of the object for each transit period based upon the images produced by the detectors. The system can further include a drive element capable of clocking the detectors of the assembly to thereby enable the detectors to separately produce images of the object. In such instances, the drive element can be capable of selectively clocking the detectors based upon the detectors producing an image of the object during a transit period.

By including a plurality of detectors, the detectors of the assembly can be arranged in a number of manners to provide a number of advantages during operation of the system to determine the angular position of the object. For example, the detectors can be arranged such that, when one or more images produced during a transit period are corrupt, the signal processor is capable of determining the angular position of the object based upon the remaining image(s) independent of (i.e., without) the corrupt image(s). Also, for example, the detectors of the assembly can be arranged such that, when an error is introduced in the system, the detectors separately experience at least a portion of the error. The signal processor can then be capable of reducing the error by averaging out the portions of the error experienced by the respective detectors. More particularly, the detectors of the assembly can be arranged such that, when the error introduced in the system comprises a fixed pattern error, the fixed pattern error is uncorrelated from detector to detector to thereby introduce diversity in the fixed pattern error over the assembly.

Also, the detectors of the assembly can be arranged offset from one another in a direction perpendicular from the vertical scanning direction. In this regard, each detector can comprise a two-dimensional matrix of charge collection sites. In such instances, the detectors can be arranged offset from one another by a distance no greater than (i.e., less than or equal to) half a height of a charge collection site. By offsetting the detectors from one another, when the error introduced in the system comprises an s-curve error, diversity is introduced in the s-curve error over the assembly.

According to other aspects of the present invention, an assembly and method for imaging an object are provided.

BRIEF DESCRIPTION OF THE DRAWINGS

Figure 1:
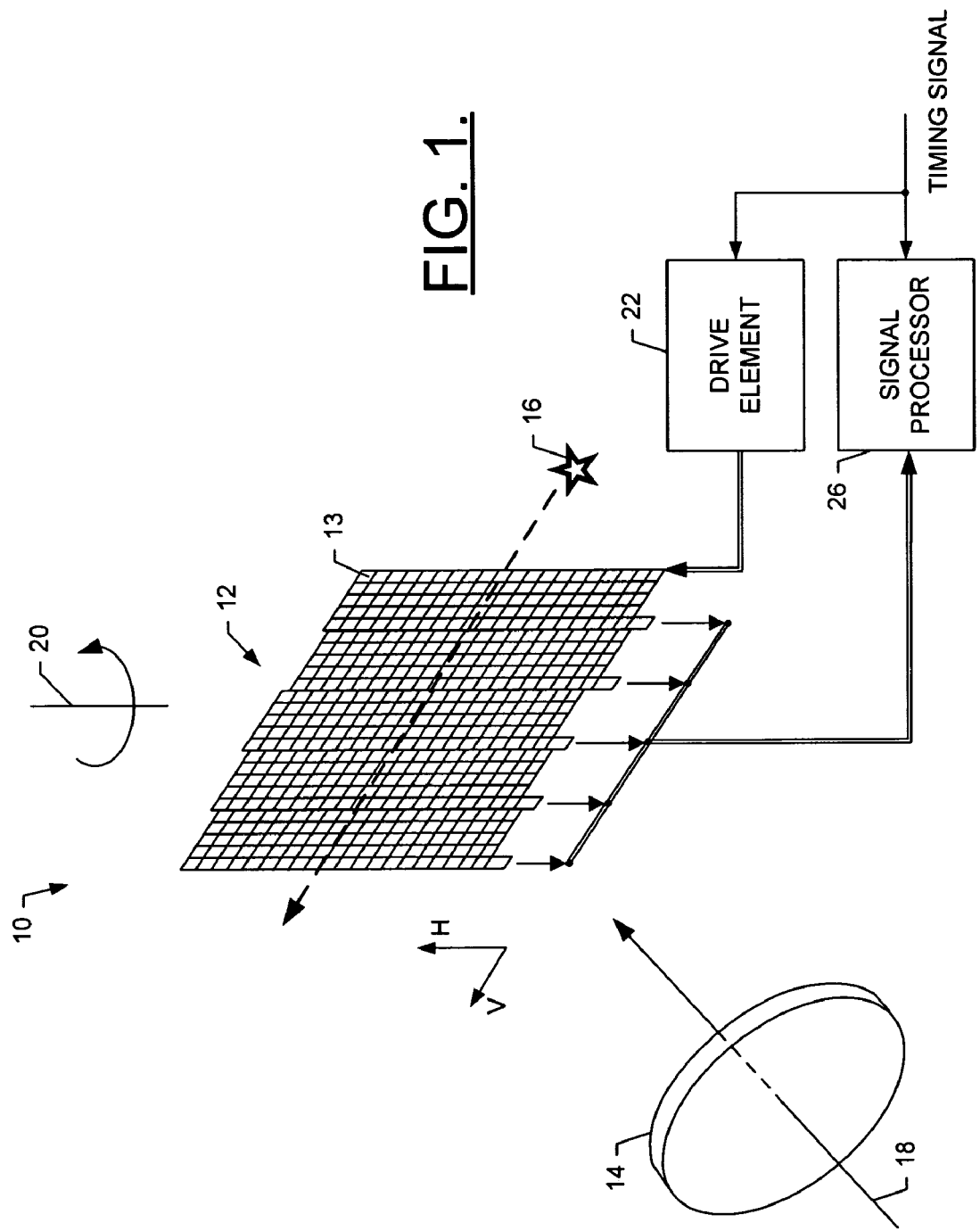
Figure 2:
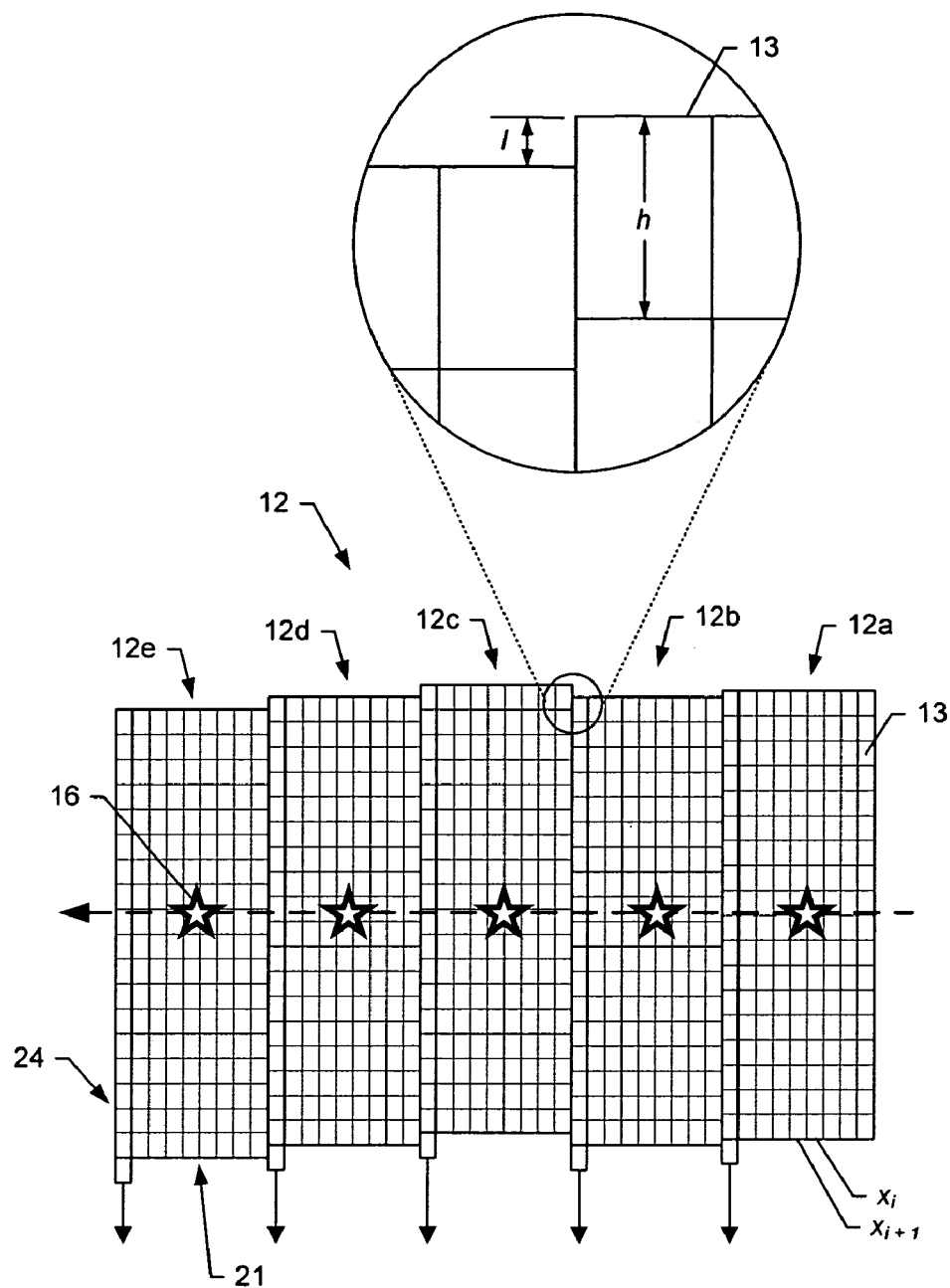
Figure 3:
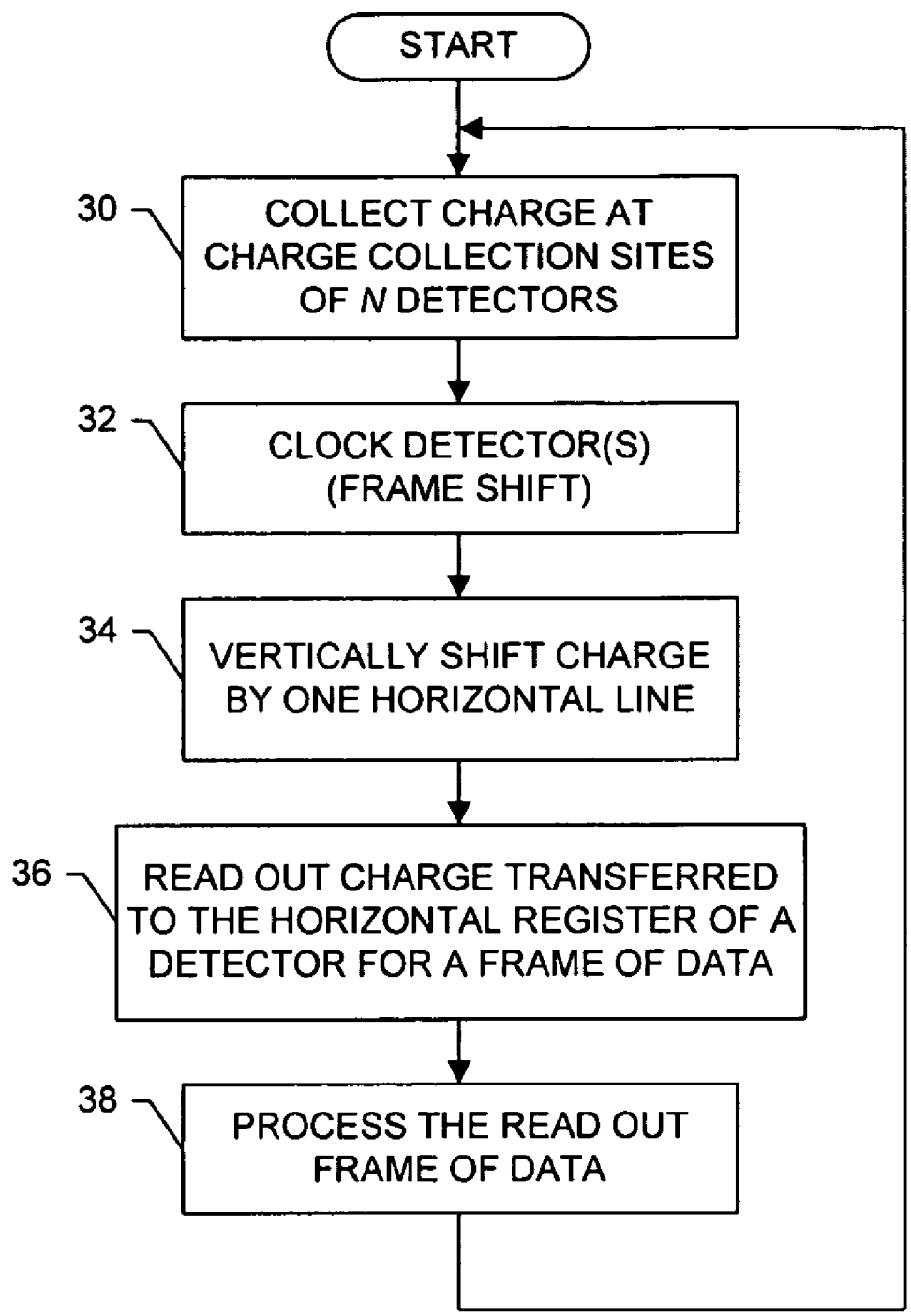
Figure 4A:
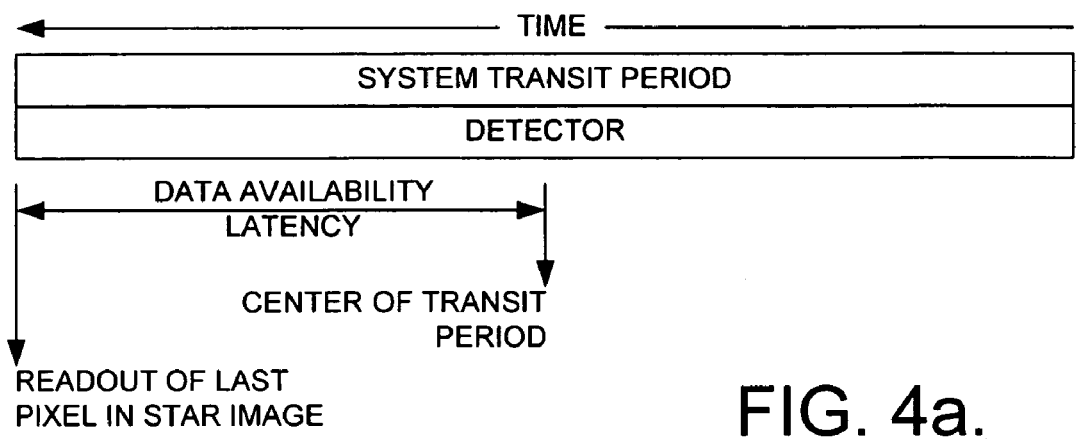
Figure 4B:
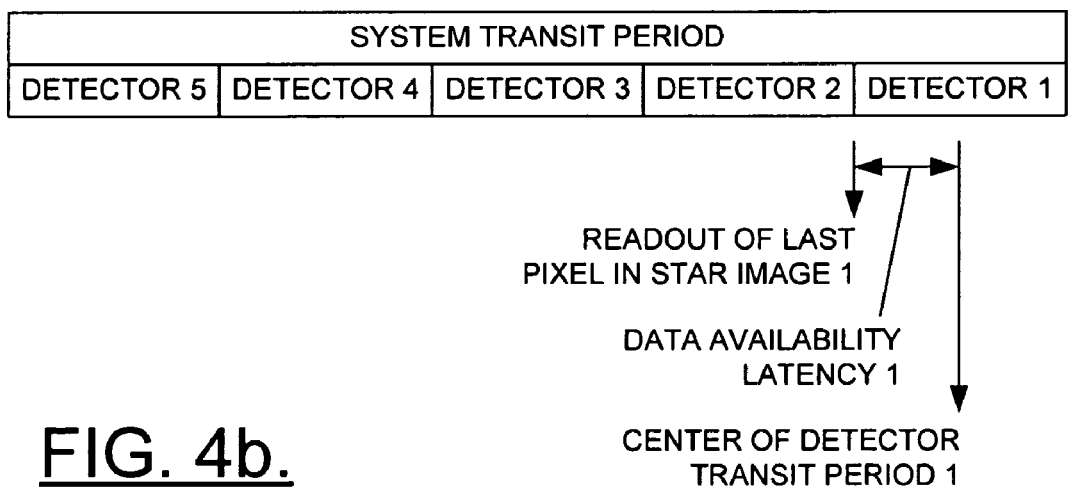
Figure 5:
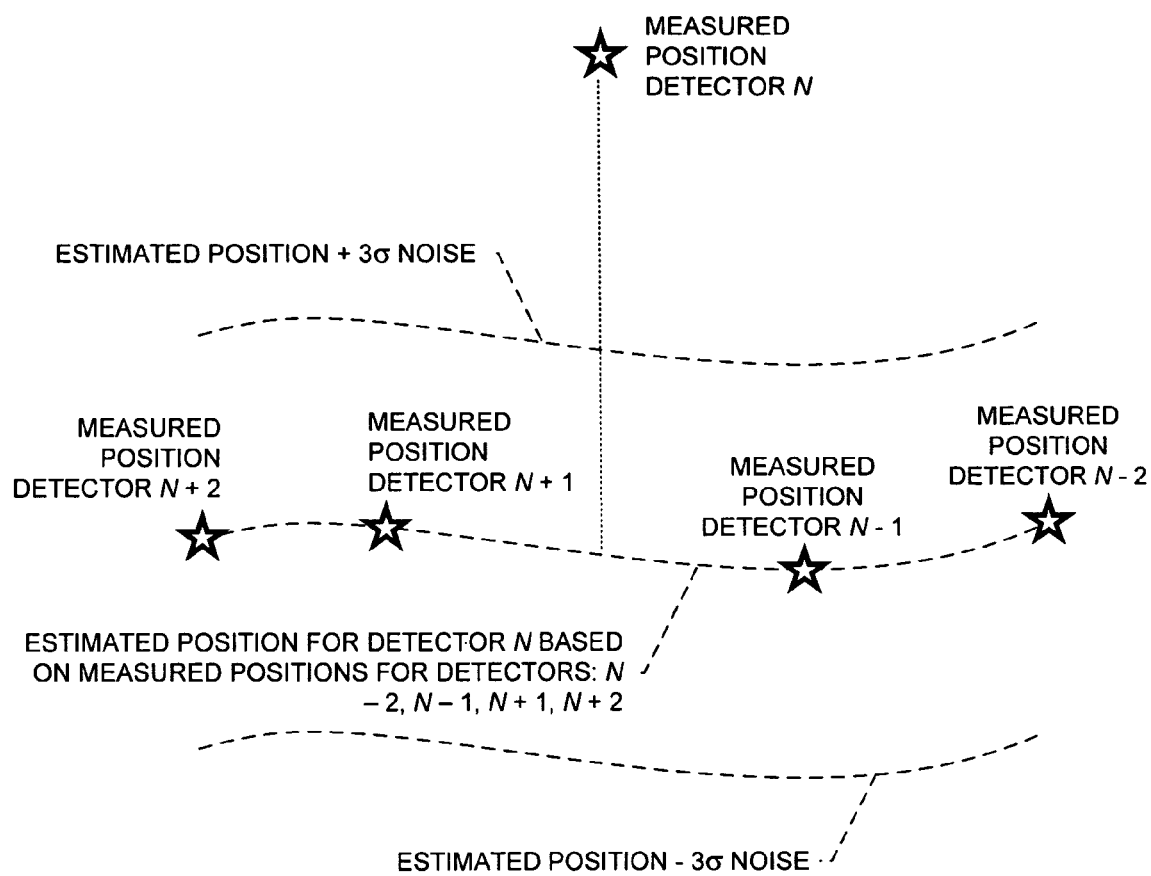
Figure 7A:
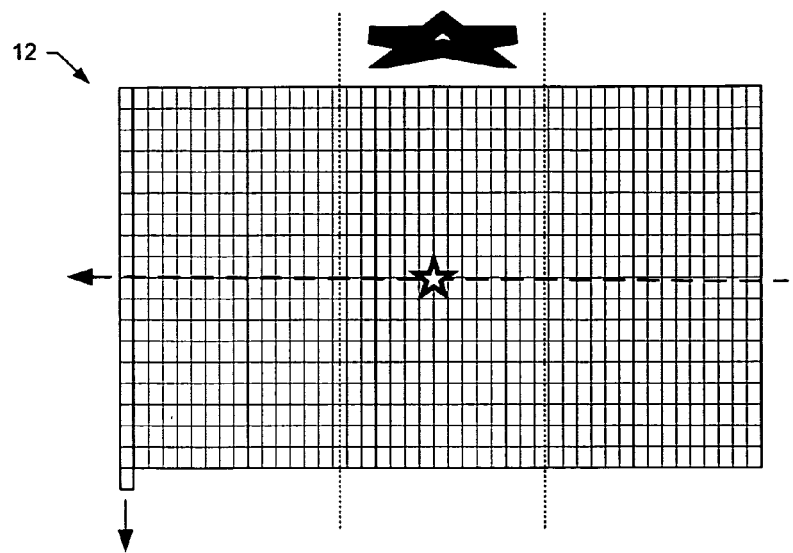
Figure 7B:
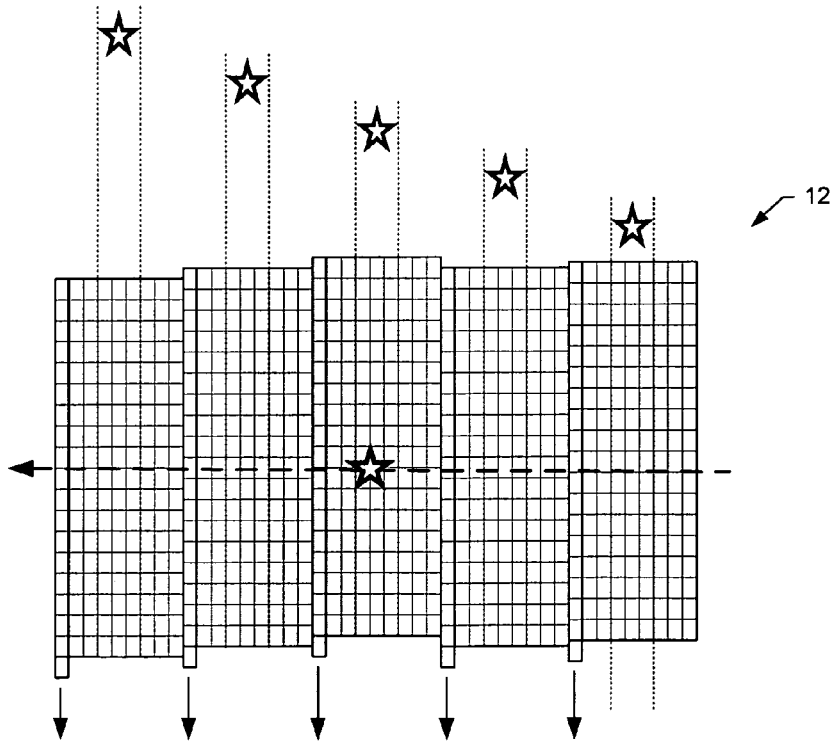
Figure 8A:
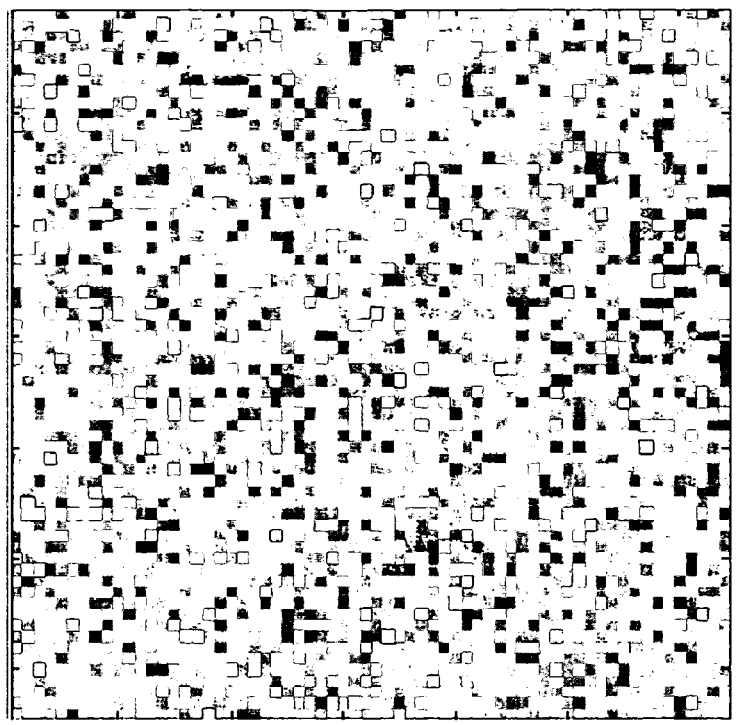
Figure 8B:
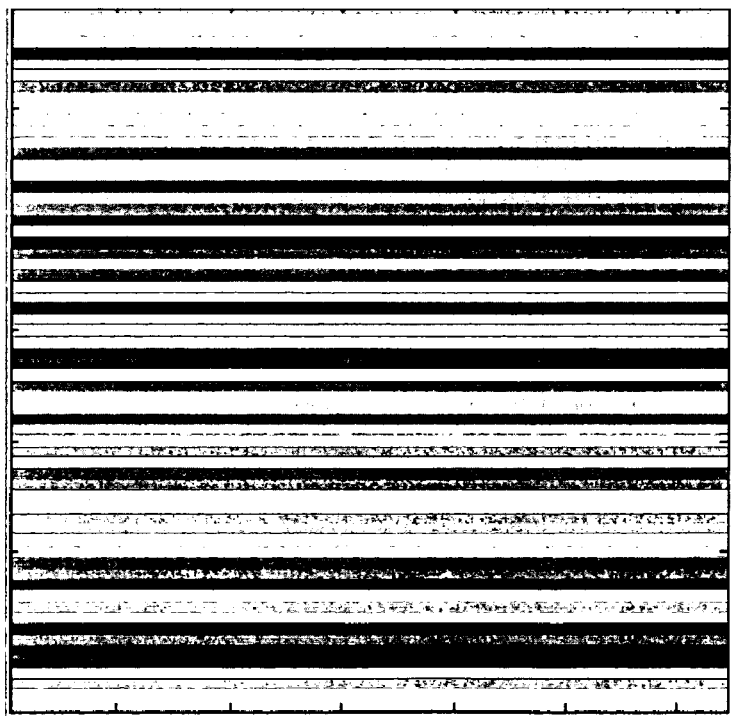
Figure 8C:
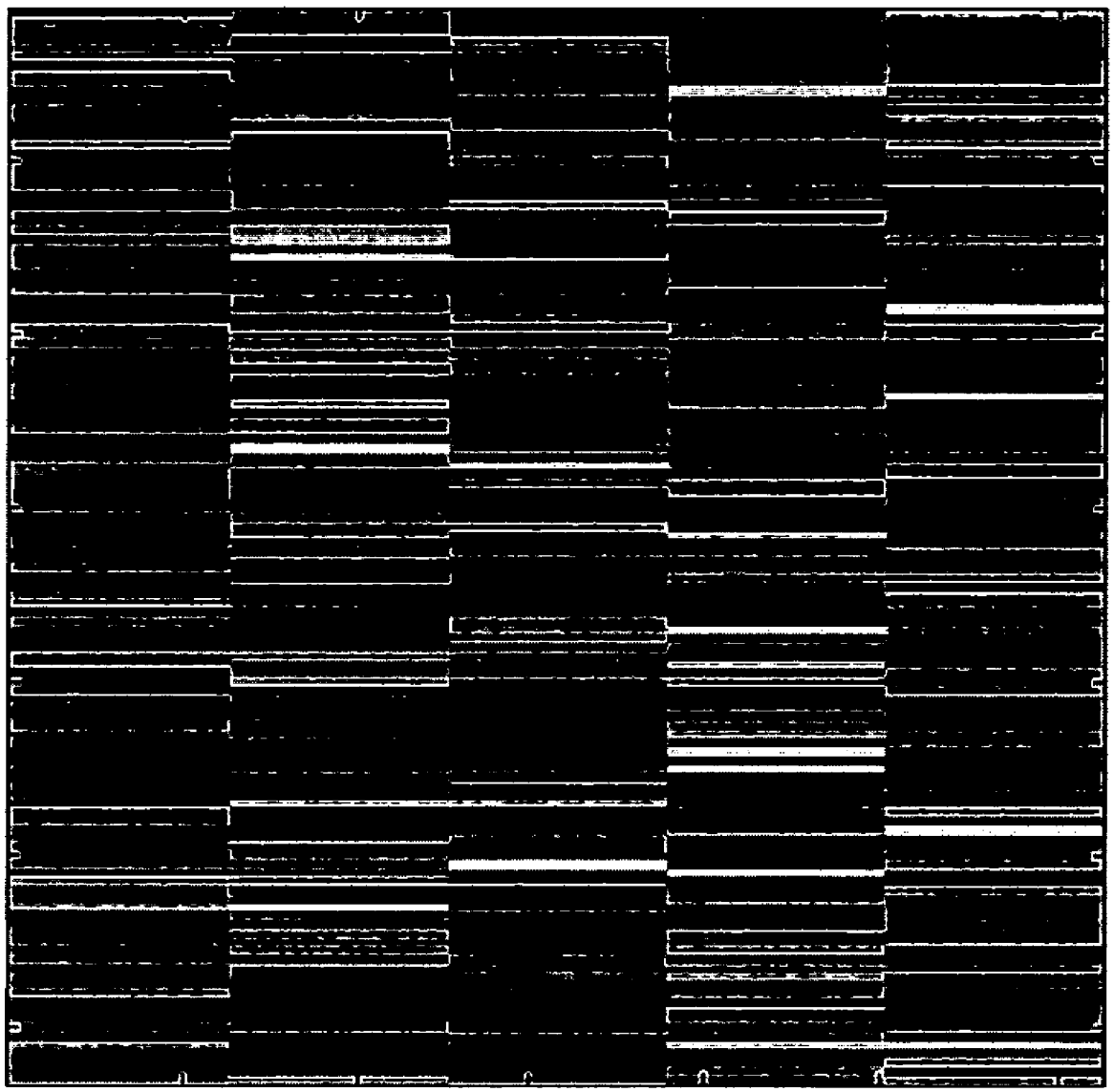
Figure 9:
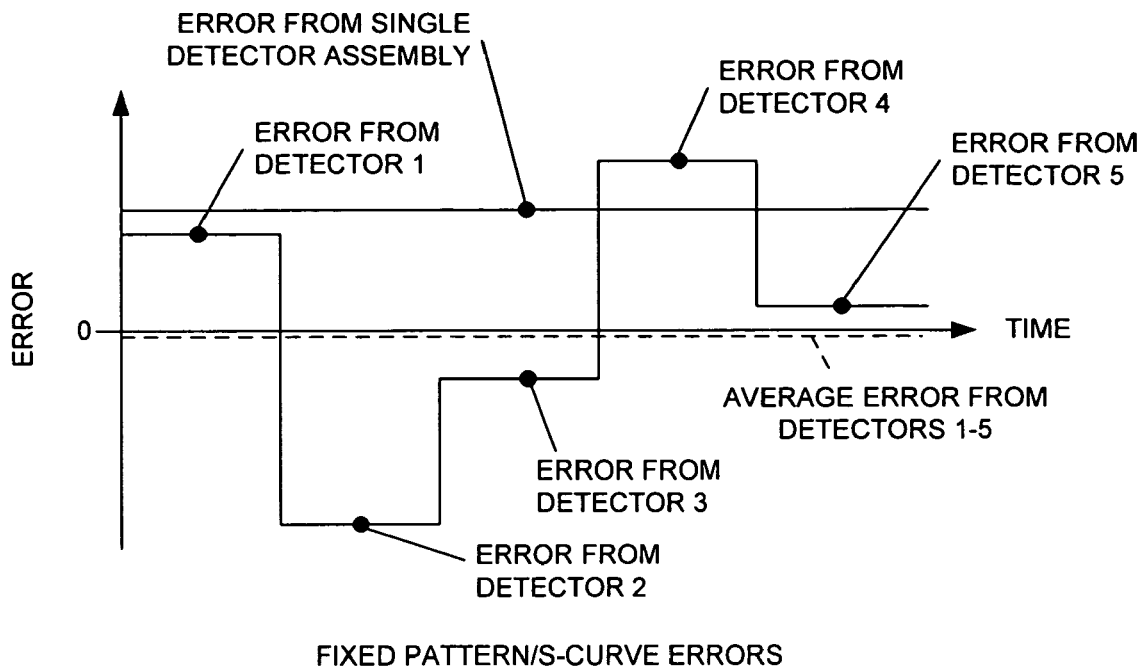
Figure 10:
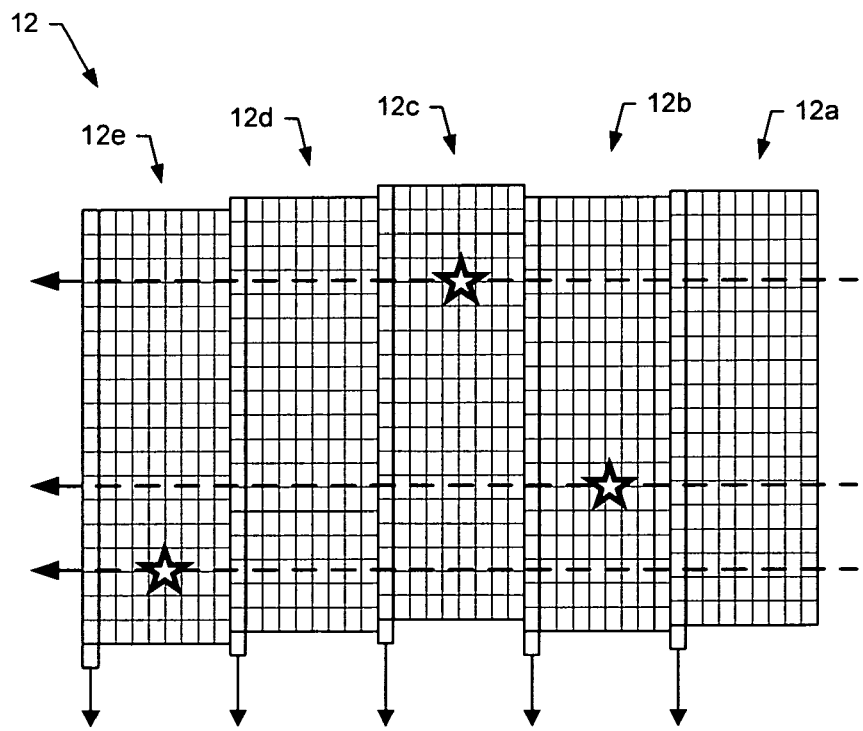

Having thus described the invention in general terms, reference will now be made to the accompanying drawings, which are not necessarily drawn to scale, and wherein:

FIG. 1 is a block diagram of a star scanning system of one exemplary embodiment of the present invention;

FIG. 2 is a block diagram of a detector assembly of the star scanning assembly of FIG. 1, the assembly including a plurality of detectors in accordance with one exemplary embodiment of the present invention;

FIG. 3 is a flowchart illustrating various steps in a method of time-delay integration (TDI) imaging an object, in accordance with one exemplary embodiment of the present invention;

FIGS. 4a and 4b illustrate the latency in data availability and update rate during the transit period in a single detector system and a multiple detector system, respectively, in accordance with one exemplary embodiment of the present invention;

FIG. 5 illustrates a technique for identifying a data sample corrupted by a transient event, in accordance with one exemplary embodiment of the present invention;

FIGS. 6a and 6b illustrate cross-track image smear during the transit period in a single detector system and a multiple detector system, respectively, in accordance with one exemplary embodiment of the present invention;

FIGS. 7a and 7b illustrate in-track image smear during the transit period in a single detector system and a multiple detector system, respectively, in accordance with one exemplary embodiment of the present invention;

FIGS. 8a, 8b and 8c illustrate spatially uncorrelated fixed pattern errors, correlated fixed pattern errors in a single detector assembly, and correlated/uncorrelated fixed pattern errors in a multiple detector system, in accordance with one exemplary embodiment of the present invention;

FIG. 9 is a graph illustrating error, such as fixed pattern error or s-curve error, in a single detector system as compared to an averaged error in a multiple detector system, in accordance with one exemplary embodiment of the present invention; and FIG. 10 is a block diagram of the detector assembly of FIG. 2, highlighting a technique of selectively clocking detectors of the detector assembly, in accordance with one exemplary embodiment of the present invention.

DETAILED DESCRIPTION OF THE INVENTION

The present invention now will be described more fully hereinafter with reference to the accompanying drawings, in which exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring to FIG. 1, an illustration of one type of system that would benefit from exemplary embodiments of the present invention is provided. The system and method of exemplary embodiments of the present invention will be primarily described in conjunction with star scanning in spacecraft attitude control applications. It should be understood, however, that the system and method of exemplary embodiments of the present invention can be utilized in conjunction with a variety of other applications, both in the space industries and outside of the space industries. In this regard, the system and method of exemplary embodiments of the present invention can be utilized in conjunction with any of a number of other applications employing time-delay integration (TDI) imaging.

As shown in FIG. 1, the system 10 of one exemplary embodiment includes a detector assembly 12 including plurality of detectors (five being shown in FIG. 2 as detectors 12a-12e) arranged in a vertical scanning direction V (i.e., in-track axis). In this regard, the detectors are typically the same size (although the sizes of one or more of the detectors may differ from one another), and can be arranged in a manner offset from one another by a distance l in a horizontal scanning direction H perpendicular to the vertical scanning direction. The offset distance l from one detector to the next may be predefined or otherwise set in any of a number of different manners, such as in a pseudorandom manner. Also, the offset distance l can be the same or differ from one detector to the next, and in one embodiment the offset distance is less than or equal to half the height h (i.e., $\leq \pm h/2$) of a charge collection site 13 of a charge-coupled device (CCD) sensor detector (explained below), as shown in the inset of FIG. 2.

The vertical scanning direction V corresponds to the direction of movement of a scene viewed by an optical arrangement 14 and imaged by the detectors, the viewed/imaged scene including one or more object images such as one or more astronomical star images 16 (one being shown in FIG. 1). The detectors are arranged in the focal plane of the optical arrangement in a direction nominally perpendicular to an optical axis 18 of the optical arrangement. The optical axis 18 of the optical arrangement is disposed nominally perpendicular to a spinning axis 20 of the system 10, which in turn, is nominally parallel to the detectors. In this regard, although the system can be configured in any of a number of different manners, the system of one exemplary embodiment is configured onboard a spacecraft, such as a satellite, that spins along the spinning axis 20. And as the optical axis 18 of the optical arrangement is disposed perpendicular to the spinning axis 20 of the satellite, and thus the system, the star image is effectively moved linearly in the vertical scanning direction V.

The detector assembly 12 of the system 10 can include any of a number of detectors, but in one embodiment, the system includes five detectors. Similarly, the system can include any of a number of different types of detectors capable of producing an image 16 of an object, such as a star, viewed by the optical arrangement 14. As explained below, in one exemplary embodiment, the detectors each comprise a CCD sensor. In such instances, the CCD sensors each include a two-dimensional matrix 21 of photosensitive charge collection sites 13. The charge collection sites are configured such that voltages corresponding to the charges at the respective sites are read from the respective CCD sensor in response to a drive element 22 applying clocking signals to transfer the charge in each row of collection sites to the succeeding row in the vertical scanning direction V (parallel transfer). The transfer continues until the charges reach a horizontal register 24, masked from light, from which charges are clocked and transferred in the horizontal scanning direction H (i.e., cross-track axis) to a signal processor 26. In this manner, the system is capable of time-delay integration (TDI) imaging the scene viewed by the optical arrangement 14. To effectively acquire the star image from a spinning satellite, the drive element and signal processor typically receive a timing signal synchronized with the spinning cycle of the satellite. During imaging of the star, each charge collection site of a detector may represent one pixel of a resulting image, and as such, an a×b matrix of charge collection sites may produce an image of a×b pixels.

As shown in FIG. 3, in operation, charges are collected at the charge collection sites 13 of the detectors 12a-12e of an N detector assembly, as shown in block 30. Then, as shown in block 32, the drive element 22 supplies one or more clock signals to the detectors to shift from one set of N frames to the next set. In response to the clock signal, the collected charges, or more particularly voltages corresponding to the collected charges, are acquired and vertically shifted from row $x_i$ to a succeeding row $x_{i+1}$ in the vertical scanning direction V (see FIG. 2), as shown in block 34. As the voltages are shifted to a succeeding row $x_{i+1}$, those voltages are added to the voltages acquired for that row during the current frame. This integration of voltages continues for successive frame shifts until the voltages are shifted onto a horizontal register 24. From the horizontal register, the voltage is then read out to the signal processor 26, as shown in block 36. In this regard, as the system 10 includes a plurality of detectors, the signal processor can successively receive readings from the horizontal registers of the detectors. The detectors could then continue for subsequent transit periods in a similar manner.

As the detectors 12a-12e of the assembly 12 read out each frame of data, the signal processor 26 can process the frame of data in accordance with a TDI technique, as shown in block 38. The signal processor can process the data in any of a number of different manners. In one embodiment, for example, the signal processor processes the data to determine the angular position of the star represented by the star image 16 produced by the system 10. For example, the signal processor can determine the azimuth of the star based upon the measured time when the star is at the center of its transit through one or more detectors during a spinning cycle of the satellite relative to a known time, such as in any of a number of known manners. Similarly, the signal processor can determine the elevation angle of the satellite based upon the position of the star image in the horizontal scanning direction H during one spinning cycle relative to a known position. By comparing the measured angular position of the stars with the catalogued angular positions the attitude of a satellite can be determined. Based upon the determined attitude, then, the satellite can be repositioned, if necessary, to thereby stabilize the satellite's attitude.

As will be appreciated, an error in the star image 16 may be introduced by when the charge collection sites 13 of the detectors 12a-12e of the assembly 12 are shifted at a rate different, or unacceptably different, from that of the star motion. In such instances, the error can be at least partially reduced by the signal processor 26 calculating the centroid of the image from the readouts of the respective detectors, as such is known to those skilled in the art.

By providing a detector assembly 12 including a plurality of separate detectors with corresponding readouts, the system 10 of exemplary embodiments of the present invention provides a number of advantages. Among these advantages include, for example, a higher update rate and reduced data latency, robustness in space radiation environments, reduced impact of image smear, reduced impact of correlated fixed pattern errors, reduced impact of S-curve errors, reduced power required to perform detector clocking, and reduced impact of degraded charge transfer efficiency, each of which is briefly explained below.

A. Higher Update Rate and Reduced Data Latency

The system can provide a readout corresponding to the star image 16 during a transit period of the star image through each detector of the assembly, as shown in FIG. 4a. As also shown in FIG. 4a, latency in the availability of a readout is typically approximately equal to half the transit period, with the readout corresponding to the star position at a time midway through its transit through the field of view of that detector. By providing a plurality of separate detectors, the star image can be effectively updated at a rate proportional to the number of detectors, with the readout latency inversely proportional to the number of detectors, as shown in FIG. 4b. Such higher update rates and reduced data latency, in turn, can reduce or even eliminate the need for gyros in some applications of the system. Further, multiple readouts of a star image during the transit period permits rate estimation solely based upon star scanner data.

B. Robustness in Space Radiation Environments

In astromomical radiation environments, high energy particles (e.g., protons) may impact one or more of the detectors of the detector assembly 12, thereby resulting in transient signal events for respective detectors. The position and/or intensity of such events can be random from frame to frame and, depending upon the energy and angle of incidence, such events may impact one or more pixels of a respective star image 16. And as will be appreciated, the probability of such an event impacting a star image increases with the effective intergration period of the system 10. Thus, by providing a detector assembly with a plurality of detectors, the effective integration period and thus the probability of a transient signal event impacting the system can be reduced. For example, if the assembly includes five separate detectors, and the probability of at least one proton impacting a star image during a transit period is 50%, there is a 99.996% probability that at least one of the five readouts corresponding to five images of the star will be valid, as shown in the following table.

TABLE

| Valid Frames (out of 5): | Probability (%): |
| --- | --- |
| 5 | 50.000 |
| 4 | 37.200 |
| 3 | 11.100 |
| 2 | 01.640 |
| 1 | 00.120 |
| 0 | 00.004 |

Protons events can result in large errors in the produced star image 16. Thus, identification of data (i.e., images) that has been corrupted by proton transient events may be required for a robust attitude determination system. By providing a plurality of star images during a transit period or cycle, one or more corrupted images from the plurality can be identified, and thereafter flagged so that the signal processor refrains from using those corrupted image(s) in determining the attitude of the satellite. In accordance with one such technique, as shown in FIG. 5, an estimated star position for a detector can be calculated from the measured star positions for a plurality of other detectors and compared to a measured star position for that detector. Then, if the measured star position falls outside a predefined threshold, such as a predefined sigma noise threshold (e.g., $\pm\sigma$ noise), that data can be flagged as being corrupted. For more information on such techniques for comparing measured star position and intensity data with estimated position and intensity data based upon previous measurements to detect transient events, see U.S. Pat. No. 5,260,577 entitled: Method and Apparatus for Acquisition and Tracking of Light Sources in a Transient Rich Environment, issued Nov. 9, 1993, the contents of which are hereby incorporated by reference in its entirety. Generally, in accordance with conventional star scanning techniques, transient rejection requires data from attitude sensors (e.g., gyros) not otherwise used in imaging the star, as well as a priori position and/or intensity from a star catalog, to determine if a measurement has been corrupted. Such techniques are often undesirably complex and less effective than the direct relative comparison that can be performed if multiple measurements of the same star per transit are available, as in exemplary embodiments of the present invention.

C. Reduced Impact of Image Smear

For TDI imaging to be effective, the star image 16 must typically move in a vertical scanning direction V across a constant row of charge collection sites 13 of respective detectors 12a-12e or otherwise maintains a constant horizontal scanning level H, and the detectors must be clocked so the charge collection sites are shifted at a rate approximately equal to the star motion. If the spinning axis 20 of the satellite, and thus the system 10, is misaligned such that the star image moves across differing rows or otherwise changes its horizontal scanning level H, or if there is residual distortion in the optical arrangement, cross-track image smear may be introduced, as shown in FIG. 6a for a single detector system. Similarly, if a mismatch exists between the rate of shifting the charge collection sites of the detectors and the star motion rate, an in-track image smear may be introduced, as shown in FIG. 7a. These types of image smear, then, can increase the sensitivity of the system's centroid error to random noise. As will be appreciated, however, the effects of both types of image smear are typically cumulative with the number of stages of charge collection sites (horizontal pixels) of a detector such that their impact one the system is linearly proportional to the number of stages per detector.

By including an assembly 12 of a plurality of detectors 12a-12e, the effects of both types of image smear and their impact on the system can be reduced as the number of stages per detector can be reduced while maintaining the same number of overall stages of the assembly, as shown in FIGS. 6b and 7b with respect to cross-track image smear and in-track image smear, respectively. More particularly, the effects of both types of image smear may be inversely proportional to the number of separate detectors in the assembly. In addition to including a plurality of detectors in the assembly, the effects of both types of image smear may be further reduced by controlling the number of stages per detector, such as by setting the number of stages per detector to maintain less than one pixel of cross-track and/or in-track motion of the star image 16.

D. Reduced Impact of Correlated Fixed Pattern Errors

As will be appreciated, at various instances the star images 16, or centroids thereof, may experience spatially uncorrelated fixed pattern errors as shown in FIG. 8a, and/or correlated fixed pattern errors. In this regard, for a detector 12, the charge collection sites 13 along a given row (in the vertical scanning direction V) follow the same "path," and as such, the fixed pattern background and response uniformity is typically completely correlated along the rows of a detector in a single detector assembly, such as in the manner shown in FIG. 8b. The impact of fixed pattern errors on image (or centroid) accuracy may depend upon the correlation of those errors. Fixed pattern background and response errors for a detector may cancel out along the in-track axis (in the vertical scanning direction V). Along the cross-track axis (in the horizontal scanning direction H), however, fixed pattern errors typically exist, with correlated fixed pattern errors having a larger detrimental impact on the system than uncorrelated fixed pattern errors.

By including an assembly 12 of a plurality of detectors 12a-12e, instead of having fixed pattern errors correlated across the entire field of view of the assembly that introduce a bias error in the cross-track axis, any such fixed pattern errors will typically only be correlated over the each detector, and be uncorrelated from detector to detector, as shown in FIG. 8c. As such, the assembly of exemplary embodiments of the present invention introduces diversity in any such bias error in the cross-track axis from detector to detector. By introducing such diversity, the bias error can be reduced in the signal processor 26 by averaging out the fixed pattern errors of the respective detectors, as shown in FIG. 9 in comparison to the fixed pattern error for an assembly including a single detector. And by averaging out the errors, the bias error can be reduced by the square root of the number of detectors in the assembly.

E. Reduced Impact of S-Curve Errors

In various instances, a systematic centroid error with a period of a charge collection site 13, commonly referred to as s-curve error, may be introduced. In such instances, an s-curve error can result from under-sampling the point spread function, such as when the point spread function includes spatial frequencies higher than one cycle/charge collection site, and using finite windows to compute the centroid. By arranging the detectors 12a-12e in the assembly 12 in a manner offset from one another by a distance l in the horizontal scanning direction H, the assembly of exemplary embodiments of the present invention introduces diversity in any such s-curve error in the cross-track axis from detector to detector. Additionally or alternatively, if so desired, s-curve diversity can be introduced in the in-track axis from detector to detector by introducing timing delays in clocking between detectors. In such instances, the detectors may or may not be arranged in alignment with one another (i.e., l=0).

By introducing s-curve diversity, the s-curve can be reduced in the signal processor 26 by averaging out the s-curve errors of the respective detectors 12a-12e, as similarly shown in FIG. 9 in comparison to the s-curve pattern error for an assembly 12 including a single detector. By averaging out the errors, the s-curve error can be reduced by the square root of the number of detectors in the assembly.

F. Reduced Power Required to Perform Detector Clocking

At any given instance, only a portion of one or more detectors 12a-12e of the assembly 12 may be receiving a collectable charge from a star or other viewed object. Thus, at any given instance, the system 10 of exemplary embodiments of the present invention may be configured to only clock those detectors receiving a collectable charge from a star or otherwise imaging a star. For the instance shown in FIG. 10, for example, as detectors 12b, 12c and 12e are currently imaging a star (three stars being imaged by the system), the drive element 22 can be configured to clock detectors 12b, 12c and 12e, without similarly clocking detectors 12a and 12d. By selectively clocking the detectors, the system of exemplary embodiments of the present invention may operate with reduced power consumption than otherwise required to clock all of the detectors of the assembly.

Generally, as a star image 16 moves across the first detector of the assembly during a given transit period, the drive element can clock the first detector 12a without similarly clocking the other detectors 12b-12e. Then, as the star image moves to and across the second detector, the drive element can cease clocking the first detector and clock the second detector, continuing to refrain from clocking detectors 12c-12e. The transit period can continue until the star image moves to and across the fifth detector, the drive element can cease clocking the fourth detector and clock the fifth detector, refraining from clocking detectors 12a-12d.

G. Reduced Impact of Degraded Charge Transfer Efficiency (CTE)

In a space radiation environment the charge transfer efficiency (CTE) of a CCD detector 12a-12e may be degraded due to proton damage. As will be appreciated, the magnitude of the charge transferred from a pixel disposed M charge collection sites 13 from the horizontal register 24 readout may be approximately equal to the CTE per collection site to the Mth power (i.e., $CTE^M$). The trapped or otherwise un-transferred charge, then, may be redistributed to the collection sites following the respective collection site. The redistribution of the trapped charge may be a function of the collection site transfer rate and a trap release time constant (~270 microseconds at 0° C.). This redistribution, however, may introduce a centroid shift which, if the collection site transfer period is longer than the trap release time constant, may be approximately proportional to $(1-CTE) \times M$.

If the entire assembly is clocked M times along the in-track axis (along the vertical scanning direction V), the number of charge transfers from one collection site 13 to the next during a transit period may be found by dividing the number of clock signals by the number of detectors N in the assembly (i.e., M/N). As shown, then, the centroid shift due to CTE may be inversely proportional to the number of detectors 12a-12e imaging the star. Thus, by including an assembly 12 with a plurality of detectors, the system of exemplary embodiments of the present invention is capable of reducing the centroid shift.

As explained above, the detectors 12a-12e of the assembly 12 of one exemplary embodiment of the present invention comprise CCD sensors. It should be understood, however, that one or more of the detectors may alternatively comprise any of a number of other types of entities capable of acquiring, imaging or otherwise producing a star image 16 viewed by the optical arrangement 14, without departing from the spirit and scope of the present invention. In such instances, the system 10 may perform TDI imaging in a number of manners such as, for example, in hardware (e.g., combining signal in space/time) or in software (e.g., time-phased co-adding).

According to one exemplary aspect of the present invention, the functions performed by one or more of the entities of the system, such as the drive element 22 and/or signal processor 26, may be performed by various means, such as hardware and/or firmware, including those described above, alone and/or under control of a computer program product. The computer program product for performing one or more functions of exemplary embodiments of the present invention includes a computer-readable storage medium, such as the non-volatile storage medium, and software including computer-readable program code portions, such as a series of computer instructions, embodied in the computer-readable storage medium.

In this regard, FIG. 3 is a flowchart of systems, methods and program products according to exemplary embodiments of the present invention. It will be understood that each block or step of the flowchart, and combinations of blocks in the flowchart, can be implemented by various means, such as hardware, firmware, and/or software including one or more computer program instructions. As will be appreciated, any such computer program instructions may be loaded onto a computer or other programmable apparatus (i.e., hardware) to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer-implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that one or more blocks or steps of the flowchart, and combinations of blocks or steps in the flowchart, can be implemented by special purpose hardware-based computer systems which perform the specified functions or steps, or combinations of special purpose hardware and computer instructions.

Many modifications and other exemplary embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system comprising:
   an optical arrangement configured to view a scene that includes an object, wherein the scene is configured to move through a field of view of the optical arrangement during each of a plurality of transit periods;
   an assembly including a plurality of detectors arranged in a vertical scanning direction corresponding to a direction of movement of the scene, wherein the detectors of the assembly are separately configured to produce an image of the object for each transit period in accordance with a time-delay integration technique; and
   a signal processor configured to determine an angular position of the object for each transit period based upon the images produced by the detectors,
   wherein the detectors of the assembly are arranged such that, when an error is introduced in the system, the detectors separately experience at least a portion of the error, and the signal processor is configured to reduce the error by averaging out the portions of the error experienced by the respective detectors, and wherein the detectors of the assembly are arranged such that, when the error introduced in the system comprises a fixed pattern error, the fixed pattern error is uncorrelated from detector to detector to thereby introduce diversity in the fixed pattern error over the assembly.

2. A system according to claim 1, wherein the detectors of the assembly are arranged such that, when at least one image produced during a transit period is corrupt, the signal processor is configured to determine the angular position of the object based upon a remaining at least one image independent of the corrupt at least one image.

3. A system according to claim 1 further comprising:
a drive element configured to clock the detectors of the assembly to thereby enable the detectors to separately produce images of the object, wherein the drive element is configured to selectively clock the detectors based upon the detectors producing an image of the object during a transit period.

4. A system comprising:
an optical arrangement configured to view a scene that includes an object, wherein the scene is configured to move through a field of view of the optical arrangement during each of a plurality of transit periods;
an assembly including a plurality of detectors arranged in a vertical scanning direction corresponding to a direction of movement of the scene, wherein the detectors of the assembly are separately configured to produce an image of the object for each transit period in accordance with a time-delay integration technique; and
a signal processor configured to determine an angular position of the object for each transit period based upon the images produced by the detectors,
wherein the detectors of the assembly are arranged such that, when an error is introduced in the system, the detectors separately experience at least a portion of the error, and the signal processor is configured to reduce the error by averaging out the portions of the error experienced by the respective detectors, and wherein the detectors are arranged in the assembly offset from one another in a direction perpendicular from the vertical scanning direction such that, when the error introduced in the system comprises an s-curve error, diversity is introduced in the s-curve error over the assembly.

5. A system according to claim 4, wherein the detectors of the assembly are arranged such that, when at least one image produced during a transit period is corrupt, the signal processor is configured to determine the angular position of the object based upon a remaining at least one image independent of the corrupt at least one image.

6. A system according to claim 4, wherein each detector comprises a two-dimensional matrix of charge collection sites, and wherein the detectors are arranged offset from one another by a distance no greater than half a height of a charge collection site.

7. A system according to claim 4 further comprising:
a drive element configured to clock the detectors of the assembly to thereby enable the detectors to separately produce images of the object, wherein the drive element is configured to selectively clock the detectors based upon the detectors producing an image of the object during a transit period.

8. A method for imaging an object, the method comprising:
viewing a scene that includes an object, wherein the scene is configured to move through a field of view of during each of a plurality of transit periods;
producing a plurality of images of the object for each transit period in accordance with a time-delay integration technique, wherein the producing step comprises separately producing an image of the object at each detector of an assembly of a plurality of detectors, the detectors being arranged in a vertical scanning direction corresponding to a direction of movement of the scene;
determining an angular position of the object for each transit period based upon the images produced by the detectors, wherein when an error is introduced in the system, the detectors separately experience at least a portion of the error, the determining step includes reducing the error by averaging out the portions of the error experienced by the respective detectors; and
arranging the detectors of the assembly before producing the plurality of images, wherein the configuring step comprises configuring the detectors such that, when the error introduced in the system comprises a fixed pattern error, the fixed pattern error is uncorrelated from detector to detector to thereby introduce diversity in the fixed pattern error over the assembly.

9. A method according to claim 8, wherein when at least one image produced during a transit period is a corrupt at least one image, the determining step comprises determining the angular position of the object based upon a remaining at least one image independent of the corrupt at least one image.

10. A method according to claim 8 further comprising:
clocking the detectors of the assembly to thereby enable the detectors to separately produce images of the object, wherein the clocking step comprises selectively clocking the detectors based upon the detectors producing an image of the object during a transit period.

11. A method for imaging an object, the method comprising:
viewing a scene that includes an object, wherein the scene is configured to move through a field of view of during each of a plurality of transit periods;
producing a plurality of images of the object for each transit period in accordance with a time-delay integration technique, wherein the producing step comprises separately producing an image of the object at each detector of an assembly of a plurality of detectors, the detectors being arranged in a vertical scanning direction corresponding to a direction of movement of the scene;
determining an angular position of the object for each transit period based upon the images produced by the detectors, wherein when an error is introduced in the system, the detectors separately experience at least a portion of the error, the determining step includes reducing the error by averaging out the portions of the error experienced by the respective detectors; and
arranging the detectors of the assembly before producing the plurality of images, wherein the detectors are arranged in the assembly offset from one another in a direction perpendicular from the vertical scanning direction such that, when the error introduced in the system comprises an s-curve error, diversity is introduced in the s-curve error over the assembly.

12. A method according to claim 11, wherein when at least one image produced during a transit period is a corrupt at least one image, the determining step comprises determining the angular position of the object based upon a remaining at least one image independent of the corrupt at least one image.

13. A method according to claim 11, wherein each detector comprises a two-dimensional matrix of charge collection sites, and wherein the arranging step comprises arranging the detectors offset from one another by a distance no greater than half a height of a charge collection site.

14. A method according to claim 11 further comprising:
clocking the detectors of the assembly to thereby enable the detectors to separately produce images of the object, wherein the clocking step comprises selectively clocking the detectors based upon the detectors producing an image of the object during a transit period.

15. An assembly comprising:
a plurality of detectors arranged in a vertical scanning direction corresponding to a direction of movement of a scene that includes an object, wherein the scene is configured to move through a field of view during each of a plurality of transit periods,
wherein the detectors of the assembly are separately configured to produce an image of the object for each transit period in accordance with a time-delay integration technique,
wherein the detectors of the assembly are arranged such that, when an error is introduced in the assembly, the detectors separately experience at least a portion of the error, and such that the error is capable of being reduced by averaging out the portions of the error experienced by the respective detectors, and
wherein the detectors of the assembly are arranged such that, when the error introduced in the assembly comprises a fixed pattern error, the fixed pattern error is uncorrelated from detector to detector to thereby introduce diversity in the fixed pattern error over the assembly.

16. An assembly according to claim 15, wherein the detectors of the assembly are arranged such that an angular position of the object for each transit period is determinable based upon the images produced by the detectors, and such that when at least one image produced during a transit period is corrupt, the angular position of the object is capable of being determined based upon a remaining at least one image independent of the corrupt at least one image.

17. An assembly according to claim 15, wherein the detectors of the assembly are capable of being clocked to thereby enable the detectors to separately produce images of the object, and wherein detectors are capable of being selectively clocked based upon the detectors producing an image of the object during a transit period.

18. An assembly comprising:
a plurality of detectors arranged in a vertical scanning direction corresponding to a direction of movement of a scene that includes an object, wherein the scene is configured to move through a field of view during each of a plurality of transit periods,
wherein the detectors of the assembly are separately configured to produce an image of the object for each transit period in accordance with a time-delay integration technique,
wherein the detectors of the assembly are arranged such that, when an error is introduced in the assembly, the detectors separately experience at least a portion of the error, and such that the error is capable of being reduced by averaging out the portions of the error experienced by the respective detectors, and
wherein the detectors are arranged in the assembly offset from one another in a direction perpendicular from the vertical scanning direction such that, when the error introduced in the assembly comprises an s-curve error, diversity is introduced in the s-curve error over the assembly.

19. An assembly according to claim 18, wherein the detectors of the assembly are arranged such that an angular position of the object for each transit period is determinable based upon the images produced by the detectors, and such that when at least one image produced during a transit period is corrupt, the angular position of the object is capable of being determined based upon a remaining at least one image independent of the corrupt at least one image.

20. An assembly according to claim 18, wherein each detector comprises a two-dimensional matrix of charge collection sites, and wherein the detectors are arranged offset from one another by a distance no greater than half a height of a charge collection site.

21. An assembly according to claim 18, wherein the detectors of the assembly are capable of being clocked to thereby enable the detectors to separately produce images of the object, and wherein detectors are capable of being selectively clocked based upon the detectors producing an image of the object during a transit period.

* * * * *